US012776382B1

(12) United States Patent
Cooper

(10) Patent No.: US 12,776,382 B1
(45) Date of Patent: Oct. 27, 2026

(54) ON-CHIP MEMORY UNIT FOR AI INFERENCE

(71) Applicant: Simon Cooper, Vaughan (CA)

(72) Inventor: Simon Cooper, Vaughan (CA)

(73) Assignee: M&S Services, Maple (CA)

( * ) Notice: Subject to any disclaimer, the term of this patent is extended or adjusted under 35 U.S.C. 154(b) by 107 days.

(21) Appl. No.: 18/991,781

(22) Filed: Dec. 23, 2024

Related U.S. Application Data

(60) Provisional application No. 63/652,068, filed on May 27, 2024, provisional application No. 63/549,509, filed on Feb. 4, 2024, provisional application No. 63/614,967, filed on Dec. 27, 2023.

(51) Int. Cl.
*G11C 19/28* (2006.01)

(52) U.S. Cl.
CPC .................................. *G11C 19/287* (2013.01)

(58) Field of Classification Search
CPC .................................................... G11C 19/287
USPC ................................................ 365/73, 238.5
See application file for complete search history.

(56) References Cited

U.S. PATENT DOCUMENTS

2015/0200016 A1* 7/2015 Rizel .................. G11C 11/5671 365/185.18
2016/0093384 A1* 3/2016 Lee ........................ G11C 16/24 365/185.12
2021/0366561 A1* 11/2021 Senoo ................ G11C 16/3495
2021/0375367 A1* 12/2021 Senoo .................... G11C 16/24

* cited by examiner

*Primary Examiner* — Michael T Tran
(74) *Attorney, Agent, or Firm* — Meitar Patents LTD.; Daniel Kligler

(57) ABSTRACT

An electronic device includes a shift register including two or more cascaded memory cells configured to store respective data bits, and a sequencing circuit. At least a memory cell among the memory cells includes a data input for shifting a data bit from a previous memory cell in the shift register, a shift input for controlling the shifting of the data bit from the previous memory cell in the shift register, a data output for shifting a data bit to a next memory cell in the shift register, and an erase signal input for erasing the data bit stored in the memory cell prior to the shifting. The sequencing circuit is configured to shift data bits in the shift register by applying a sequence of erasure signals to erase inputs of the memory cells, and a sequence of shift signals to the shift inputs of the memory cells.

19 Claims, 8 Drawing Sheets

ON-CHIP MEMORY UNIT FOR AI INFERENCE

CROSS-REFERENCE TO RELATED APPLICATIONS

This application claims the benefit of U.S. Provisional Patent Application 63/614,967, filed Dec. 27, 2023, U.S. Provisional Patent Application 63/549,509, filed Feb. 4, 2024, and U.S. Provisional Patent Application 63/652,068, filed May 27, 2024, whose disclosures are incorporated herein by reference.

FIELD OF THE INVENTION

The present invention relates generally to an on-chip memory, and particularly to methods and circuits for designing an on-chip memory unit for storing AI model weights and/or parameters.

BACKGROUND

Sometimes, AI models, when trained, implement a sequence of calculations between inputs and a set of parameters (also referred to as weights). Trained models can have 10s and sometimes 100s of GBytes of parameters or more. To use such AI models, or perform inference, one would take an input, for example, text, speech, and/or images, and perform the sequence of calculations as per the model's architecture, using all or many of the parameters.

Such parameters are conventionally stored in Dynamic Random Access Memory (DRAM) that is coupled to a GPU, CPU, or Inference chip that performs the calculation. These parameters are conventionally stored in an external DRAM chip because common on-chip storage techniques typically comprise Static Random Access Memory (SRAM) and/or Flip-Flops offer considerably less memory capacity than DRAM. However, using off-chip DRAM entails longer access time, higher power consumption and higher system cost.

For background on memory for AI inference, see, for example, "AI and Memory Wall", A. Gholami et. al., University of California, Berkeley, (arXiv:2403.14123v1 [cs.LG] 21 Mar. 2024).

SUMMARY

An embodiment of the present invention that is described herein provides an electronic device including a shift register. The shift register includes two or more cascaded memory cells configured to store respective data bits, and a sequencing circuit. At least a memory cell among the memory cells includes (i) a data input for shifting a data bit from a previous memory cell in the shift register, (ii) a shift input for controlling the shifting of the data bit from the previous memory cell in the shift register, (iii) a data output for shifting a data bit to a next memory cell in the shift register, and (iv) an erase signal input for erasing the data bit stored in the memory cell prior to the shifting. The sequencing circuit is configured to shift data bits in the shift register by applying (i) a sequence of erasure signals to erase inputs of the memory cells and (ii) a sequence of shift signals to shift inputs of the memory cells.

In some embodiments, the shift register further includes a latch that is cascaded with the memory cells. In an embodiment, the shift register is configured to rotate the data bits from a last memory cell to a first memory cell of the shift register via the latch.

In a disclosed embodiment, the memory cell further includes a capacitor configured to store an electrical charge indicative of the respective data bit.

In some embodiments, the memory cell further includes a shift-in transistor, configured to shift a data bit of a previous memory cell in the shift register to the memory cell. The shift-in transistor may include an N-channel MOS transistor.

In some embodiments, the memory cell further includes an erase transistor configured to set the respective data bit to a first binary value responsively to the Erase input. The erase transistor may include a P-channel MOS transistor.

In some embodiments, the memory cell further includes an output transistor, configured to drive a next memory cell of the shift register according to the data bit that is stored in the memory cell. The output transistor may include an N-channel MOS transistor.

In some embodiments, the memory cell includes an MOS transistor and a diode that is connected in parallel to the MOS transistor, and the erase signal input includes a pulse that is applied to the source of the MOS transistor, thereby setting the data bit of next memory cell of the shift register to a first binary value.

There is additionally provided, in accordance with an embodiment of the present invention, a method in an electronic device that includes a shift register. The method includes storing two or more data bits in respective two or more cascaded memory cells in the shift register. At least a memory cell among the memory cells includes (i) a data input for shifting a data bit from a previous memory cell in the shift register, (ii) a shift input for controlling the shifting of the data bit from the previous memory cell in the shift register, (iii) a data output for shifting a data bit to a next memory cell in the shift register, and (iv) an erase signal input for erasing the data bit stored in the memory cell prior to the shifting. Data bits are shifted in the shift register by applying (i) a sequence of erasure signals to erase inputs of the memory cells and (ii) a sequence of shift signals to shift inputs of the memory cells.

The present disclosure will be more fully understood from the following detailed description of the embodiments thereof, taken together with the drawings in which:

DETAILED DESCRIPTION

Overview

AI inference, typically implemented as a sequence of mathematical operations that are performed between input and pre-trained parameters. For better performance, parameters may be stored on the same die as the inference circuitry; however, in a CMOS process that is optimized for efficient logic circuitry, on chip memory such as SRAM, offers limited capacity when compared to DRAM.

Embodiments to be disclosed below provide for circuits and methods that offer alternative on chip memory to SRAM and can store more data per the same silicon area, and are suitable for CMOS implementation. In an embodiment, a plurality of identical memory cells, each memory cell storing one data bit, are cascaded, to form a shift register. A Sequencer sequentially sends a Erase signal followed by a Shift signal to each of the memory cells of the shift register. Each memory cell sets the respective data bit responsively to the Erase signal to a first binary value (e.g., logic-1). Then, responsively to the Shift signal, sets the data bit to a second binary value (that is the opposite of the first binary value) if the data bit stored in the preceding memory cell in the shift register is at the first binary value.

In some embodiments, the memory cell comprises a storage node that stores the binary data bit; in embodiment, the storage node comprises a capacitor. In other embodiment, the storage node relies on the capacitance of the gate of a transistor that is connected to the storage node, and does not include an additional capacitor device. In an embodiment, the shift register further comprises a null-latch that is cascaded with the memory cells.

In an embodiment to be disclosed below, the memory cell comprises a shift-in N-MOS transistor to shift data into the memory cell that is activated by a Shift signal, a Erase P-MOS transistor that is activated by an Erase signal to charge the data bit to logic high, and a Data storage and Output N-MOS transistor to conditionally discharge the data bit of the next memory cell.

In another embodiment, the memory cell comprises a PMOS transistor and optionally a diode that are connected in parallel. The drain of the transistor is connected to a Vdd signal, which in idle model could be set to 0V; pulsed low for pre-discharging the data bit of the next memory-cell in the shift register and pulsed-high to conditionally charge the next cell data bit, according to the data bit of the memory cell.

In another embodiment, a stacked shift register is used, wherein the shift register is divided into multiple smaller shift registers that are chained together so that they can operate concurrently.

DETAILED DESCRIPTION

Figure 1:
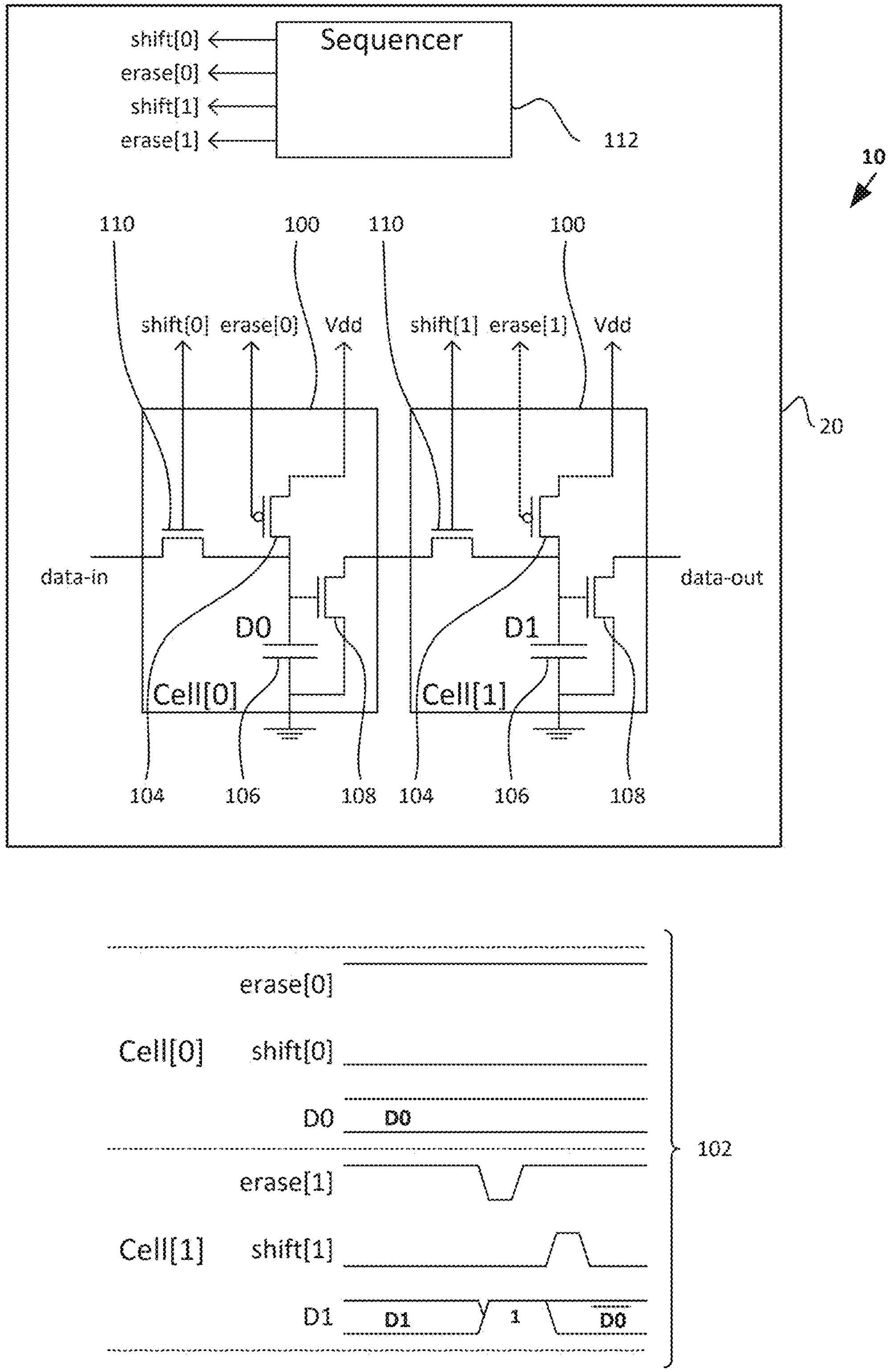
FIG. 1 is a block diagram that schematically illustrates an Electronic Device, comprising a shift register, which, in turn, comprises cascaded memory cells, including an interconnected pair of memory cells, in accordance with an embodiment that is disclosed herein.

FIG. 1 is a block diagram that schematically illustrates an Electronic Device 10, comprising a Shift Register 20, which, in turn, comprises cascaded memory cells, including an interconnected pair of Memory Cells 100, in accordance with an embodiment that is disclosed herein. The two Memory Cells are denoted Cell[0] and Cell[1]. Each one of the Memory Cells comprises an Erase transistor 104, an (optional) Storage Capacitor 106, a Storage and Output transistor 108 and a Shift-In Transistor 110. In addition, each one of the Memory Cells comprises a data-input for shifting a data bit from a previous memory cell 100 in the shift register 20, and a data output for shifting a data bit to a next memory cell 100 in the shift register 20, an Erase signal input for erasing the data bit stored in the Memory Cell 100 and a Shift input signal to control loading of data from the previous Memory Cell 100 in the Shift Register 20.

Memory Cells 100 may be used, for example, in rotating shift registers that are configured to sequentially output stored data, for example, AI parameters to AI inference circuits and/or to other logic circuitry. Two or more such Memory cells 100 may be connected together to create a shift register 20 of preferred length.

The operation of Memory Cells 100 will now be described, with reference to Waveforms 102. A Sequencer 112 is configured to drive the control signals shift[1:0] and erase[1:0] according to the illustrated Waveforms 102. Sequencer 112 may be a dedicated logic circuit for the operation of a single Shift Register 20 and/or shared among multiple such Shift Registers 20.

According to the example embodiment illustrated in FIG. 1, the shift from Cell[0] to Cell[1] is performed in the following sequence: Initially, for example, Cell[0] holds data D0 and Cell[1] holds data D1 (data is stored on the capacitance of the gate of the Storage and Output transistor 108 and/or on the Storage Capacitor 106). First, Sequencer 112 drives erase[1] signal low, so that Erase Transistor 104 of Cell[1] opens, and charges a Storage Device 106, and/or the gate of Storage and Output Transistor 108, to logical one, erasing the D1 value and setting the value in D1 to logical one. Next, the Sequencer 112 sets erase[1] to high, closing Erase Transistor 104 of Cell[1].

Next, the Sequencer drives shift[1] high, opening Shift-In Transistor 110 of Cell[1]. If D0 of Cell[0] is at logical one, Storage and Output Transistor 108 of Cell[0] opens, and will drain the charge of Storage Capacitor 106 of Cell[1] and/or of the gate of Storage and Output transistor 108 of Cell[1], setting D1 to logical zero.

On the other hand, if the value of D0 of Cell[0] is at logical zero, Output Transistor 108 of Cell[0] will be closed and will not drain either the charge of Storage Capacitor 106 of Cell[1] and/or the charge at the gate of Storage and Output Transistor 108 of Cell[1]; the charge will, therefore, remain at logical one, i.e., the inverted value of D0.

In some embodiments, the Storage Capacitor 106 may comprise a capacitor as an element connected to the gate of the Storage and Output Transistor 108. In other embodiments the capacitance of the gate of the Storage and Output Transistor 108 (and of other elements that are connected thereto) could serve to store the data and no Storage Capacitor 106 may be needed.

The configuration of memory cells 100 illustrated in FIG. 1 and described herein above is cited by way of example. Other configurations may be used in alternative embodiments. For example, in some embodiments, transistor 104 may be a NMOS transistor (the erase input, in this case, will be set to a voltage level higher than Vdd to erase the stored data).

Figure 2A:
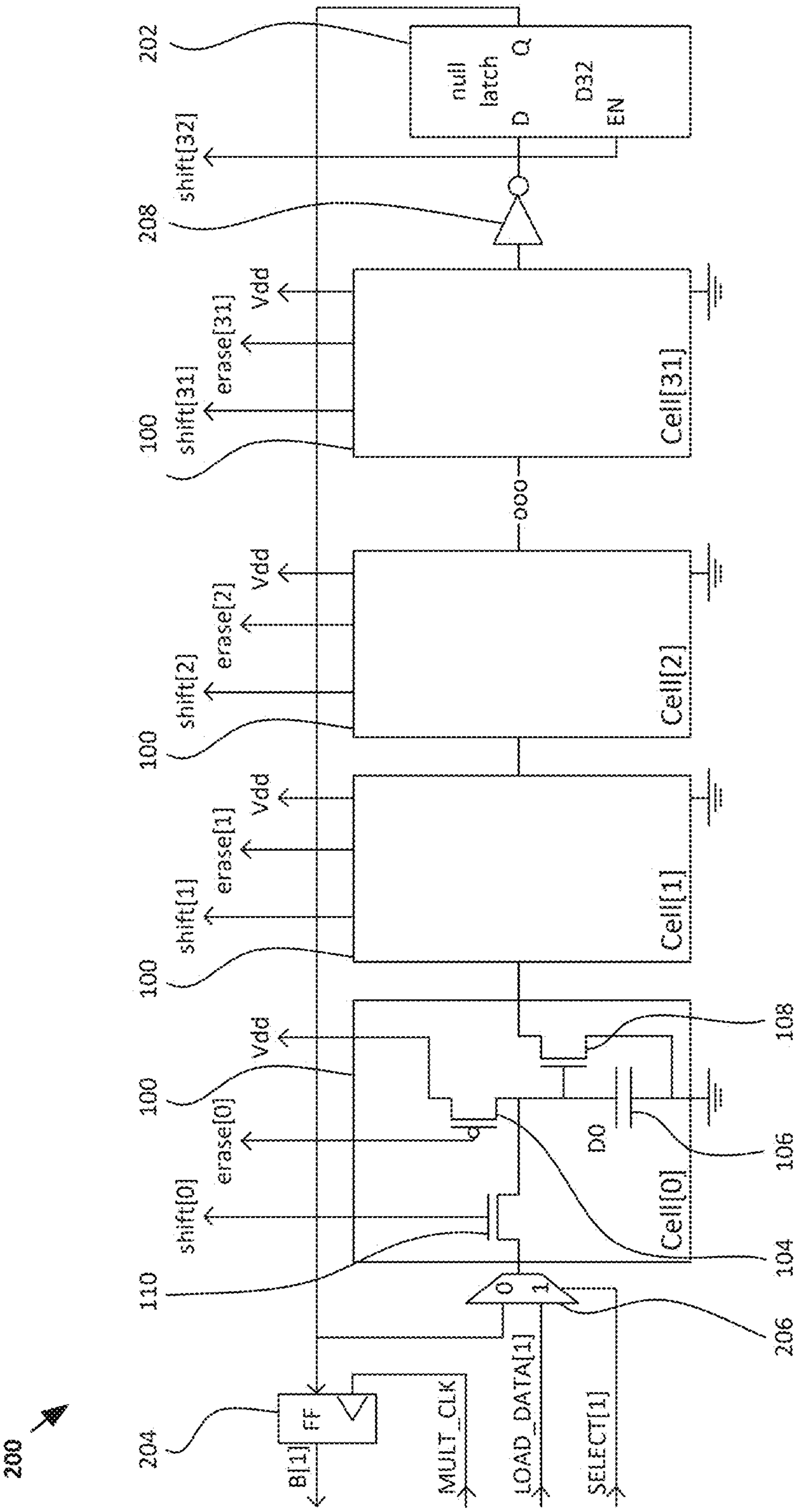
FIG. 2A is a block diagram that schematically illustrates a Rotating Shift Register, in accordance with an embodiment that is disclosed herein.

FIG. 2A is a block diagram that schematically illustrates a Rotating Shift Register 200, in accordance with an embodiment that is disclosed herein. Rotating Shift Register 200 is configured to send sequential data, e.g., to an AI inference circuit (not shown) and/or to other logic circuitry on a chip.

According to the example embodiment illustrated in FIG. 2A, the Rotating Shift Register 200 comprises 32 Memory Cells 100 (as described with reference to FIG. 1) and a Null Latch 202. In embodiments, Null Latch 202 may comprise any suitable CMOS latch, as known in the art; in other embodiments Null Latch 202 may comprise a $33^{rd}$ Memory Cell 100. An Inverter 208 inverts the data that is sent from Cell[31] to Null Latch 202; in some embodiments, inverter 208 is not implemented and, instead, the inverted Q output of Null-Latch 202 is used in leu of the Q output thereof.

Rotating Shift Register 200 further comprises a Flip-Flop 204, which is configured to sample and hold one of the bits of the rotating data, for example, towards AI Interferer circuit (not shown) and/or to other on chip circuitry, upon positive or negative edges of MULT_CLK input, and a Multiplexer 206, which is configured to either enable loading new data into the Rotating Shift Register 200 or enable the rotation of the current data stored in the Rotating Shift Register 200, according to a Select[1] input of the Multiplexer 206. In some embodiments, Flip-Flop 204 may not be implemented and, instead, data will be read directly from the Null Latch 202 and/or the last memory cell (Cell[31]) 100 of the Rotating Shift Register 200.

Figure 2B:
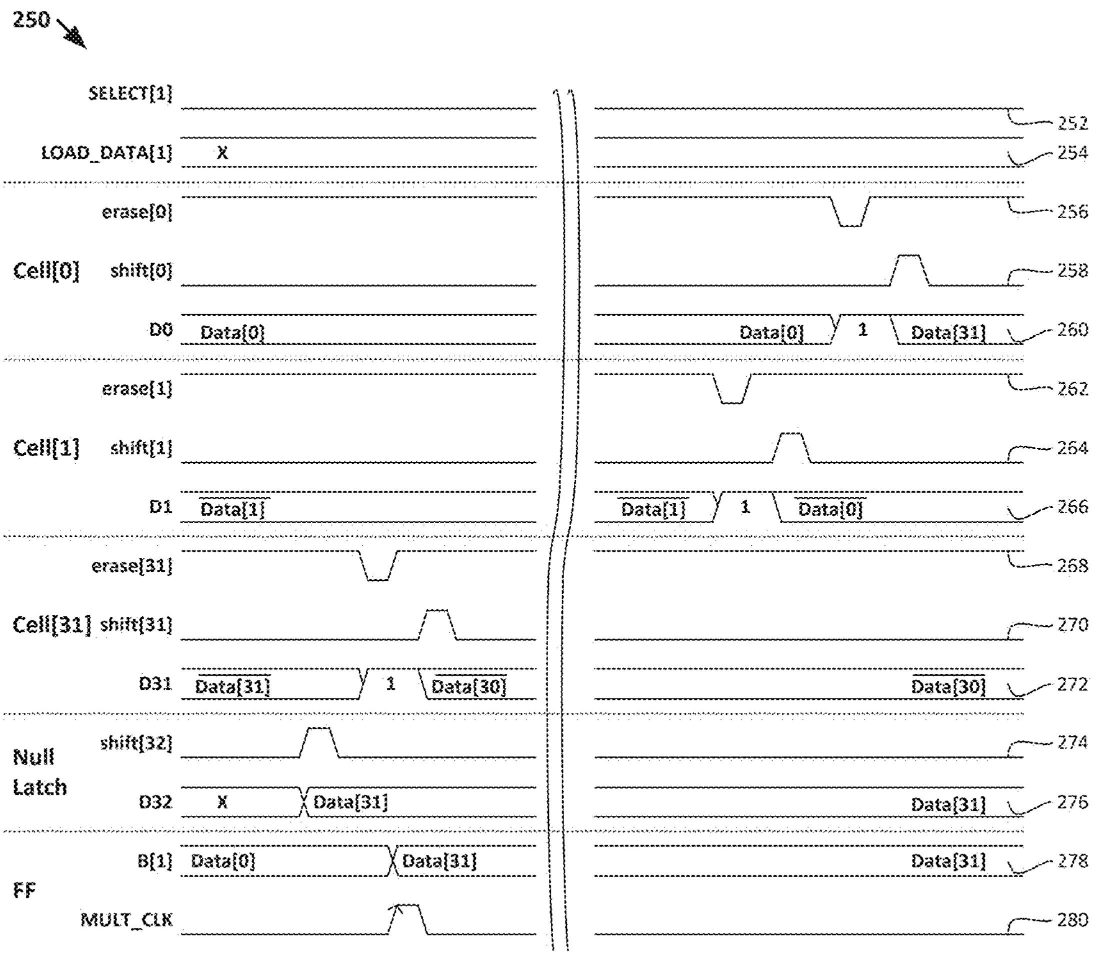
FIG. 2B is a timing diagram that schematically illustrates data shift waveforms of signals in a Rotating Shift Register, in accordance with an embodiment that is disclosed herein.

FIG. 2B is a timing diagram that schematically illustrates waveforms 250 of signals in Rotating Shift Register 200 (FIG. 2A), in accordance with an embodiment that is disclosed herein.

Waveforms 250 refer to circuits and signals in FIG. 2A, and comprise:

- A Select[1] waveform 252, which illustrates the Select[1] input of Multiplexer 206;
- A LOAD_DATA[1] waveform 254, which illustrates the LOAD_DATA[1] input of Multiplexer 206;
- An Erase[0] waveform 256, a Shift[0] waveform 258 and a D0 waveform 260, illustrating, respectively, the Erase, Shift input and the stored data D0 of Cell[0];
- An Erase[1] waveform 262, a Shift[1] waveform 264 and a D1 waveform 266, illustrating the Erase, Shift input and the stored data of Cell[1];
- An Erase[31] waveform 268, a Shift[31] waveform 270 and a D31 waveform 272, illustrating the Erase, Shift input and the stored data of Cell[31];
- A Shift[32] waveform 274 and a D32 waveform 276, illustrating, respectively, the Shift and data of Null Latch 202 and
- A B[1] waveform 278 and a MULT_CLK waveform 280, illustrating respectively, the B[1] output signal and the clock input of Flip-Flop 204.

In the example embodiment illustrated in FIG. 2A and the timing diagram of FIG. 2B, the shift of thirty two bits of data stored in Cell[0] through Cell[31] is performed when Select [1] is held low, in the following sequence: First the Null Latch 202 samples the data stored in Cell[31] via Inverter 208 by driving shift[32] high and then low. Next the erase and shift signals of Cell[31] through Cell[0] are driven in sequence, starting with erase and shift of Cell[31] and going down to Cell[0] to complete a shift of data by one bit within the Rotating Shift Register 200.

Once Null Latch 202 has sampled the next data to be used from Cell[31], Flip-Flop 204 could sample the data into B[1] to be used, e.g., by an AI inference circuit and/or other circuitry. Data shifted into Cell[0] comes via Multiplexer 206 from Null Latch 202 or from last Memory Cell 100 (Cell[31]) if Null Latch 202 and/or Inverter 208 are not implemented.

In order to maintain the data stored in Cell[0] thorough Cell[31] and to perform data refresh, the Rotating Shift Register 200 has to constantly rotate the data regardless of whether the data is currently used or not. Accordingly, D0 Waveform 260 is set to the value of D[31] following a pulse on shift[0] 258. In further rotation sequences, further data bits will be shifted right and around, both to refresh the stored data and to read the next data bit in the Rotating Shift Register 200.

In some embodiments, Sequencer 112 may time the rotation rate of data within the Rotating Shift Register 200, to match the preferred read times of such data by AI inference circuits and/or by other on chip circuitry, for example via Flip-Flop 204. When no data output is needed, Sequencer 112 may rotate the data at slower rate within the Rotating Shift Register 200, for data storage refresh.

Figure 2C:
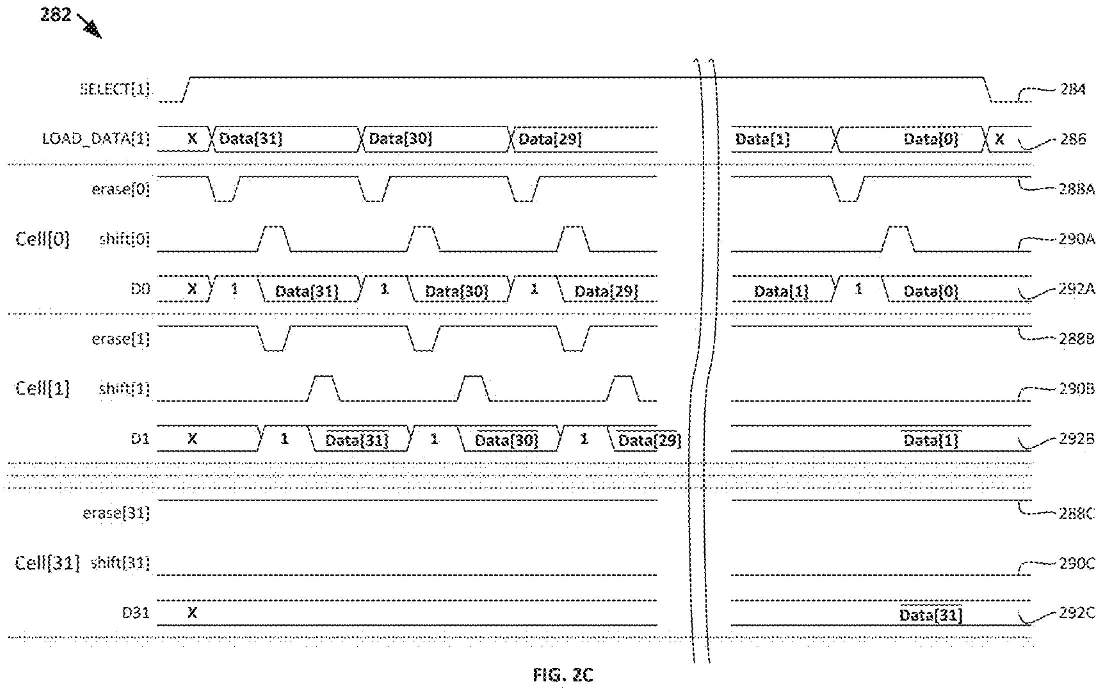
FIG. 2C is a timing diagram that schematically illustrates data load waveforms of signals in Rotating Shift Register, in accordance with an embodiment that is disclosed herein.

FIG. 2C is a timing diagram that schematically illustrates data load waveforms 282 of signals in Rotating Shift Register 200 (FIG. 2A), in accordance with an embodiment that is disclosed herein.

Waveforms 282 refer to circuits and signals in FIG. 2A, and comprise:

- A Select[1] waveform 284, which illustrates the select[1] input of Multiplexer 206;
- A LOAD_DATA[1] waveform 286, which illustrates the LOAD_DATA[1] input of Multiplexer 206;
- An Erase[0] waveform 288A, a Shift[0] waveform 290A and a D0 waveform 292A, illustrating, respectively, the Erase, Shift inputs and the stored data D0 of Cell[O];
- An Erase[1] waveform 288B, a Shift[1] waveform 290B and a D1 waveform 292B, illustrating the Erase, Shift inputs and the stored data of Cell[1]; and
- An Erase[31] waveform 288C, a Shift[31] waveform 290C and a D31 waveform 292C, illustrating the Erase, Shift inputs and the stored data of Cell[31].

In the example embodiment illustrated in FIG. 2A, and the timing diagram of FIG. 2C, SELECT[1] 284 is driven high. Data is loaded into Rotating Shift Register 200 through LOAD_DATA[1] 286 serially bit by bit by driving the erase and shift signals of Cell[0] through Cell[31] in accordance with the waveform of FIG. 2C. The data inverts each time it shifts between the cells. The data at LOAD_DATA[1] starts first with the most significant bit Data[31] and goes down to Data[0].

Figure 3A:
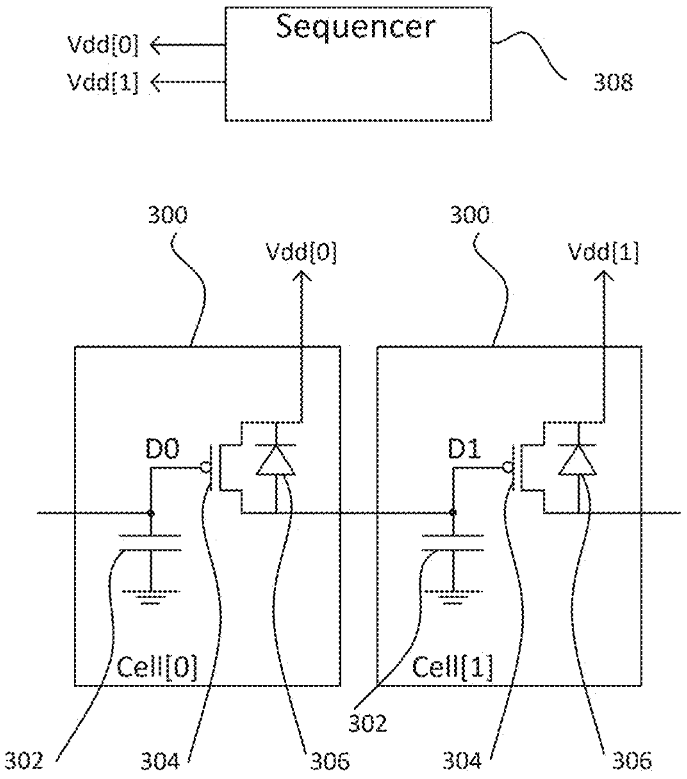
FIG. 3A is a block-diagram that schematically illustrates an interconnected pair of Reduced-Area Memory Cells that are coupled to a Sequencer, in accordance with an embodiment that is disclosed herein.
Figure 3B:
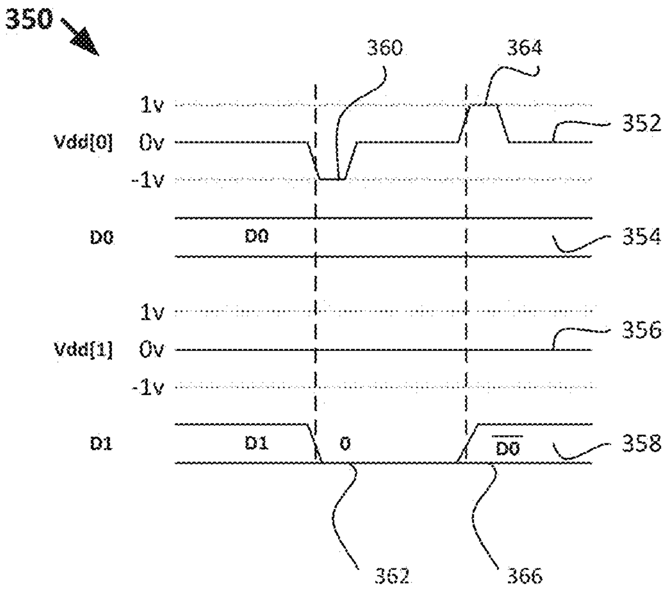
FIG. 3B is a timing diagram that schematically illustrates the waveforms of signals of a Rotating Shift Register that comprises reduced-area memory cells, in accordance with an embodiment that is disclosed herein.

FIG. 3A is a block-diagram that schematically illustrates an interconnected pair of Reduced-Area Memory Cells 300 that is coupled to a Sequencer 308, in accordance with an embodiment that is disclosed herein;

FIG. 3B is a timing diagram that schematically illustrates the waveforms 350 of signals in a Rotating Shift Register that comprises reduced-area memory cells 300, in accordance with an embodiment that is disclosed herein.

Memory cells 300 are similar in function to memory cells 100, as shown in FIG. 1. In some embodiments, such cells 300 could be used instead of Memory Cells 100 in the Rotating Shift Register 200 of the type shown in FIG. 2A and in some embodiments both cell types 100 and 300 could be used together within same Rotating Shift Register 200 and/or on a same chip within different Rotating Shift Registers 200.

According to the example embodiment illustrated in FIG. 3A, two memory cells 300, designated Cell[0] and Cell[1], are chained together to demonstrate how data retention and shifting could be achieved, while multiple such cell 300 and, optionally, a Null Latch, could be chained together to create a Rotating Shift Register of any desired length, similar to Rotating Shift Register 200 of the type shown in FIG. 2A.

Cell[0] 300 holds data D0 and Cell[1] 300 holds data D1, where D0 and D1 are represented as a charge held at the gate of transistor 304 and/or capacitor 302 of Cell[0] and Cell[1] respectively. A Sequencer 308 is configured to drive Vdd[0] and Vdd[1] according to the Waveforms 350.

When no shift is performed, data D0 and D1 are maintained by holding Vdd[0] of Cell[0] and Vdd[1] of Cell[1] at a voltage, in this example 0V, that preferably leads to a low leakage from the gate of transistor's 304 of Cell[0] and Cell[1].

We will now describe a shift operation, with reference to a Vdd[0] waveform 352, a D0 waveform 354, a Vdd[1] waveform 356 and a D1 waveform 358 (all referring to corresponding signals in Reduced-Area Memory Cells 300).

We will refer below to voltage levels (in absolute terms) of the threshold of PMOS transistor 304 as Logic-0, and to higher absolute voltage levels as Logic-1. We assume that the forward voltage of Diode 306 is higher than Logic-1. For example, in an embodiment, Logic-0 is a voltage level between 0.1V and 0, whereas Logic-1 is a voltage level above 0.5V.

A shift from Cell[0] to Cell[1] is performed in the following sequence: first, Sequencer 308 drives Vdd[0] 352 of Cell[0] to a negative voltage 360, for example −1V, so diode 306 of Cell[0] will open and drain (erase) the charge at the gate 358 of transistor 304 of Cell[1], erasing the D1 value and bringing the voltage 358 at the gate of transistor 304 of Cell[1] to Logic-0 362.

Next, to perform a shift of data, the Sequencer 308 sets Vdd[0] to a high level 364, in this example +1V. If D0 354 is at Logic-0, transistor 304 of Cell[0] will open, and D1 358 will be set to Logic-1; if, however, D0 354 is at Logic-1, transistor 304 of Cell[0] will not open and D1 358 will remain at Logic-0. In other words, the combined erase and shift operations will set D1=~D0 (or, in yet other words, D1 will be set to the inverted logical value of D0 366).

The signal sequence 360, 364 of Vdd[0] 352 essentially first erases the value at D1 358, bringing D1 first to Logic-0 362, and then copies the inverted value of D0 into D1 366. We refer to this operation as a shift, since when connecting multiple such cells 300 together in similar fashion to the schematic illustration described in FIG. 2A and driving control signals in a sequence, similar to the sequence described in FIG. 2B, a functionality of a shift register can be achieved.

The configuration of Reduced-Area Memory Cells 300 and the corresponding waveforms 350, illustrated in FIGS. 3A, 3B and described above, are cited by way of example.

Other configurations may be used in alternative embodiments. For example, in some embodiments, the memory cell 300 could have a capacitor 302 connected to the gate of transistor 304 to store the charge representing the data. In other embodiments the capacitance of the gate of the transistor 304 could serve to store the data, and no capacitor 302 might be needed.

In some embodiments diode 306 could be absent, and the voltage driven onto Vdd[0] and Vdd[1] could be selected so that the transistor 304 itself will open in a similar manner as if the diode 306 was still present.

In an embodiment, a complementary configuration is used, wherein Transistor 304 is N type, with the voltage levels on Vdd and the polarity of Diode 306 modified accordingly.

Figure 4:
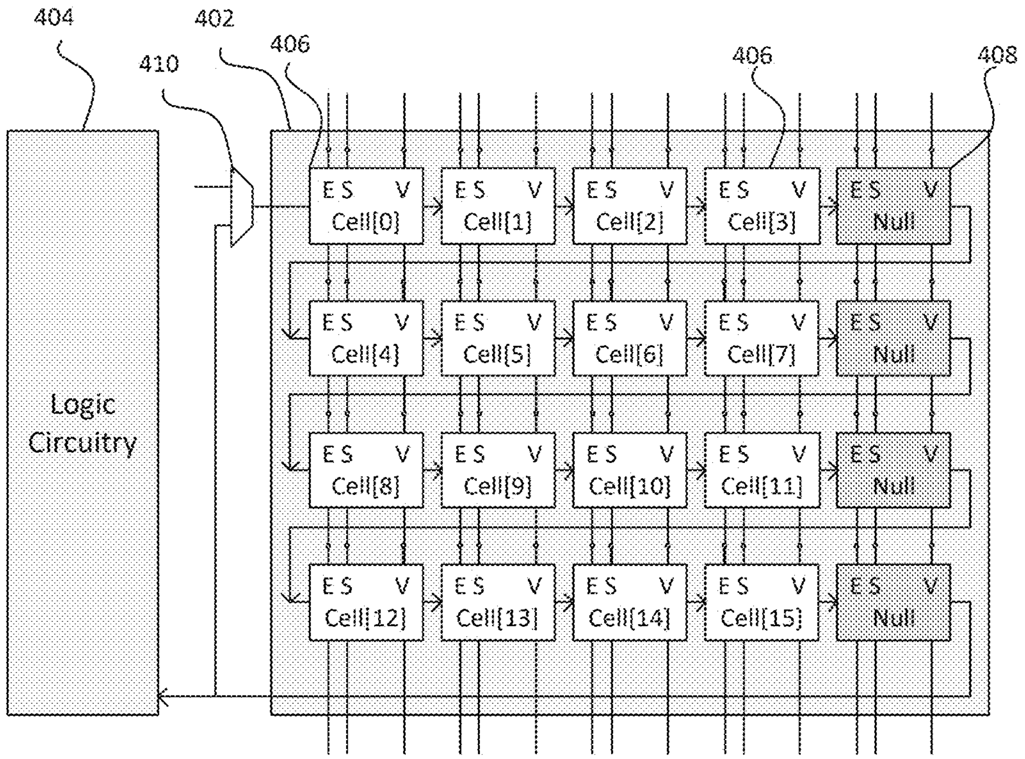
FIG. 4 is a block diagram that schematically illustrates a stacked Rotating Shift Register, in accordance with an embodiment that is disclosed herein.

FIG. 4 is a block diagram that schematically illustrates a Rotating Shift Register 402 that is coupled to Logic Circuitry 404, in accordance with an embodiment that is disclosed herein.

In some embodiments, the layout of a rotating shift register such as Rotating Shift Register 200 (FIG. 2A) does not match the layout of the Logic Circuitry 404 that is coupled thereto, and, hence, could lead to inefficient silicon layout. In addition, in embodiments, the rotation rate within such Rotating Shift Register 200 is not fast enough to match the requirement of Logic Circuitry 404; in yet other embodiments, the routing of the control signals from Sequencer 112 to memory cells 100 of Rotating Shift Register 200 may be inefficient.

To mitigate, Rotating Shift Register 402 is arranged as a stacked rotating shift register with Shift and Erase signals of memory cells 406 common per column. This approach requires extra null memory cells 408 to enable shift without data loss, but it enables a layout of the rotating shift register 402 that is scalable in both depth and width and does not create layout issues for the Erase and Shift signals for either the memory cells 406 or the null memory cells 408. A single Multiplexer 410 is configured to allow loading of the memory cells from an external source (not shown).

The shift of data within memory cells 406 of Rotating Shift Register 402 is performed in a similar manner to the data shift shown in FIG. 2B. However, in this Rotating Shift Register 402 all the rows shift simultaneously, which comes at a cost of having one extra null cell 408 per row but allows a faster shift of the data within the Rotating Shift Register 402.

The configuration of Rotating Shift Register 402 illustrated in FIG. 4 and described herein above is cited by way of example. Other configurations may be used in alternative embodiments. For example, in some embodiments, Null Memory cells 408 are similar or identical to memory cells 406; in an embodiment, the Null Memory cells may be implemented as latches or flip-flops for example. In other embodiments, a single Sequencer 112 can drive more than one Rotating Shift Register 200. In an embodiment, Rotating Shift Register 402 could be of any length.

In embodiments, some or all of Memory Cells 400 may comprise Memory Cells 100 (FIG. 1), Memory Cells 300 (FIG. 3A), and/or any combinations thereof.

In embodiments wherein the Null Memory cells 408 are same as Memory Cells 406, the last column does not have to be the column that does not hold any data and is only used to enable the shifting of data without data loss.

Any column could be designated to operate as a null column, and it therefore could be selected by the system controlling the Rotating Shift Register 402.

Figure 5:
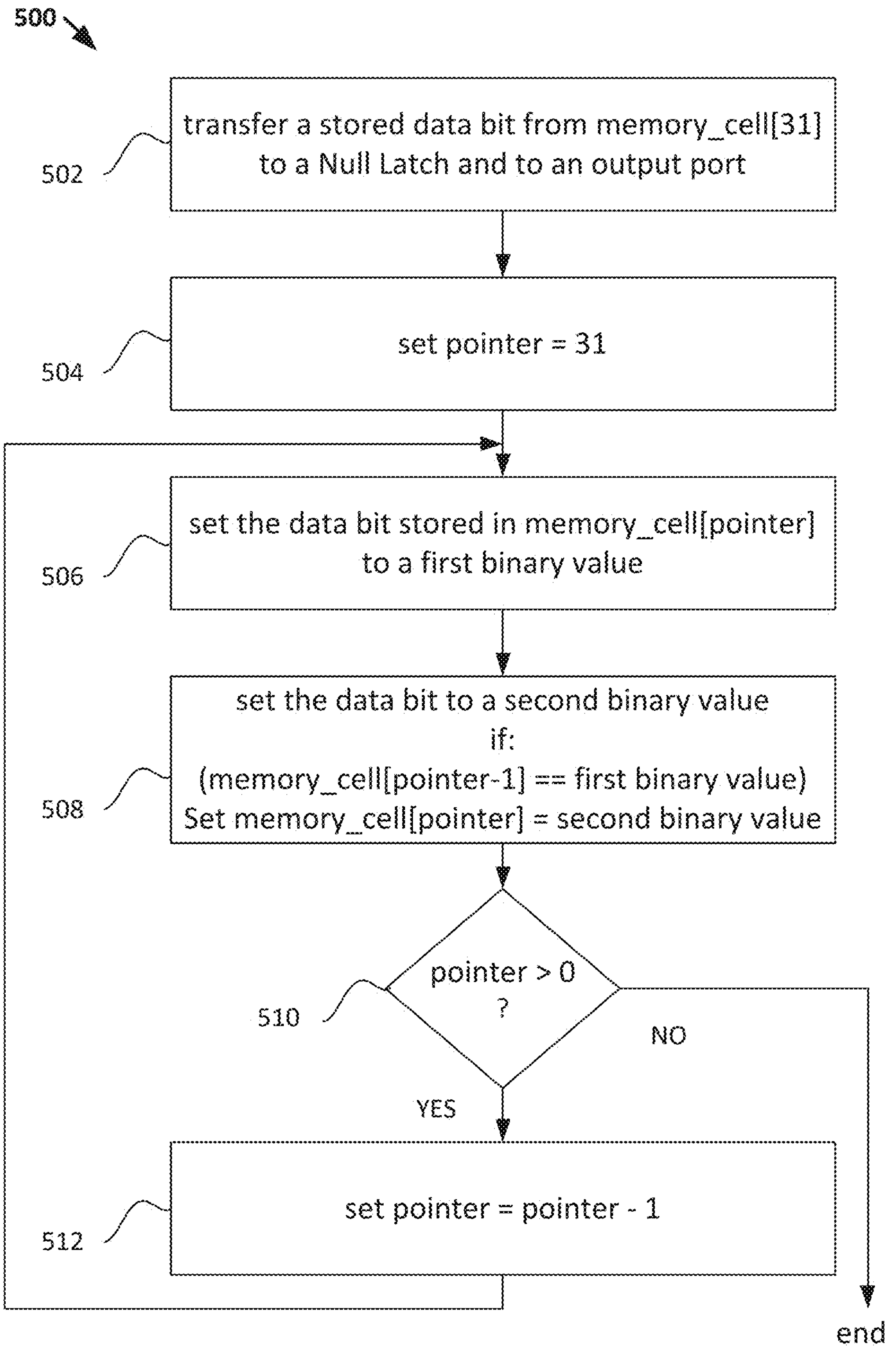
FIG. 5 is a flowchart that schematically illustrates a method for shifting data in memory cells, in accordance with an embodiment that is disclosed herein.

FIG. 5 is a flowchart 500 that schematically illustrates a method for shifting data in memory cells, in accordance with an embodiment that is disclosed herein. The method is executed by Sequencer 112 (FIG. 1), and by the Rotating Shift Register 200 (FIG. 2A). We assume that Rotating Shift Register 200 comprises 32 Memory Cells 100, designated Memory_Cell[31:0], and a Null Latch 202.

The flowchart starts at a Transfer_MSB_to_Latch operation 502, wherein the Sequencer generates a control signal to copy the data in Memory_Cell[31] to the Null Latch 202 (in some embodiments, the copied data is inverted). The copied data is also output from the Rotating Shift Register, e.g., to an AI inference logic circuit and/or to other logic circuits.

Next, at a Set-Pointer-31 operation 504, the Sequencer sets the value of a register, referred to as Pointer, which is used to point to one of the memory cells, to the value of 31.

Now, at a Set-Bit operation 506, the sequencer sets the data stored in memory_cell[pointer] to a first binary value, e.g., Logic-1, and then, at a Conditionally-Set-Bit operation 508, activates a Shift from memory cell[pointer-1] to memory cell[pointer], whereby setting the data stored in memory_cell[pointer] to a second binary value (e.g., logic-0) if, and only if, the data stored memory_cell[pointer-1] is at the first binary value (pointer values are limited to {0 . . . 31} and, if pointer=0, pointer-1 is defined to be 31). Thus, operations 506 and 508 jointly perform a negated-shift operation:

memory_cell[pointer]=*not*(memory_cell[pointer-1]).

Next, at a Check-Pointer-Greater-Than-0 operation 510, the sequencer checks if the pointer value is still more than 0. If so, the sequencer, at a Decrement-Pointer operation 512, will decrement the pointer value and then reenter operation 506, to conditionally negate-shift the next (lower-index) bit of the Rotating Shift Register.

If, in operation 510, the pointer value is 0, the flowchart ends.

Thus, the method of flowchart 500 sequentially rotates the data stored in the Rotating Shift Register through all memory cells and through the Null Latch, outputting the bits serially, e.g., to a AI inference circuits and/or to other logic circuitry.

The configuration of flowchart 500 illustrated in FIG. 5 and described herein above is cited by way of example. Other suitable flowcharts may be used in alternative embodiments.

The configurations of electronic device 10, Shift Register 20, Memory Cells 100, Rotating Shift Register 200, Memory Cells 300, Rotating Shift Register 402, including any subsystems thereof, the waveforms 102, 250, 282 and 350 and the method of flowchart 500, illustrated in FIGS. 1 through 5 and described hereinabove, are example configurations, waveforms and flowcharts that are depicted purely for the sake of conceptual clarity. Any other suitable configurations, waveforms and flowcharts can be used in alternative embodiments. The electronic device and components thereof may be implemented using suitable hardware, such as in one or more Application-Specific Integrated Circuit (ASIC) or Field-Programmable Gate Arrays (FPGA), using software, using hardware, or using a combination of hardware and software elements.

Although the embodiments described herein mainly address memory cells, the methods and systems described herein can also be used in other applications, such as embedded System on Silicon (SoC) memories.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. An electronic device comprising a shift register, the shift register comprising:

two or more cascaded memory cells configured to store respective data bits, at least a memory cell among the memory cells comprises:

a data input for shifting a data bit from a previous memory cell in the shift register;

a shift input for controlling the shifting of the data bit from the previous memory cell in the shift register;

a data output for shifting a data bit to a next memory cell in the shift register; and an erase signal input for erasing the data bit stored in the memory cell prior to the shifting; and a sequencing circuit, configured to shift data bits in the shift register by applying (i) a sequence of erasure signals to erase inputs of the memory cells and (ii) a sequence of shift signals to shift inputs of the memory cells.

2. The electronic device according to claim 1, wherein the shift register further comprises a latch that is cascaded with the memory cells.

3. The electronic device according to claim 2, wherein the shift register is configured to rotate the data bits from a last memory cell to a first memory cell of the shift register via the latch.

4. The electronic device according to claim 1, wherein the memory cell further comprises a capacitor configured to store an electrical charge indicative of the respective data bit.

5. The electronic device according to claim 1, wherein the memory cell further comprises a shift-in transistor, configured to shift a data bit of a previous memory cell in the shift register to the memory cell.

6. The electronic device according to claim 5, wherein the shift-in transistor comprises an N-channel MOS transistor.

7. The electronic device according to claim 1, wherein the memory cell further comprises an erase transistor configured to set the respective data bit to a first binary value responsively to the Erase input.

8. The electronic device according to claim 7, wherein the erase transistor comprises a P-channel MOS transistor.

9. The electronic device according to claim 1, wherein the memory cell further comprises an output transistor, configured to drive a next memory cell of the shift register according to the data bit that is stored in the memory cell.

10. The electronic device according to claim 9, wherein the output transistor comprises an N-channel MOS transistor.

11. The electronic device according to claim 1, wherein the memory cell comprises an MOS transistor and a diode that is connected in parallel to the MOS transistor, and wherein the erase signal input comprises a pulse that is applied to the source of the MOS transistor, thereby setting the data bit of next memory cell of the shift register to a first binary value.

12. A method in an electronic device that includes a shift register, the method comprising:

storing two or more data bits in respective two or more cascaded memory cells in the shift register, at least a memory cell among the memory cells comprising:

a data input for shifting a data bit from a previous memory cell in the shift register;

a shift input for controlling the shifting of the data bit from the previous memory cell in the shift register;

a data output for shifting a data bit to a next memory cell in the shift register; and an erase signal input for erasing the data bit stored in the memory cell prior to the shifting; and shifting data bits in the shift register by applying (i) a sequence of erasure signals to erase inputs of the memory cells and (ii) a sequence of shift signals to shift inputs of the memory cells.

13. The method according to claim 12, wherein the shift register further comprises a latch that is cascaded with the memory cells.

14. The method according to claim 13, wherein shifting the data bits comprises rotating the data bits from a last memory cell to a first memory cell of the shift register via the latch.

15. The method according to claim 12, wherein storing a data bit in the memory cell comprises storing an electrical charge, indicative of the respective data bit, in a capacitor.

16. The method according to claim 12, wherein shifting the data bits comprises shifting a data bit of a previous memory cell in the shift register, to the memory cell, using a shift-in transistor in the memory cell.

17. The method according to claim 12, wherein shifting the data bits comprises setting a respective data bit in the memory cell to a first binary value, responsively to the Erase input, using an erase transistor.

18. The method according to claim 12, wherein shifting the data bits comprises drive a next memory cell of the shift register, according to the data bit that is stored in the memory cell, using an output transistor.

19. The method according to claim 12, wherein the memory cell comprises an MOS transistor and a diode that is connected in parallel to the MOS transistor, and wherein the erase signal input comprises a pulse that is applied to the source of the MOS transistor, thereby setting the data bit of next memory cell of the shift register to a first binary value.

* * * * *